(12) United States Patent
Ono et al.

(10) Patent No.: US 11,289,631 B2
(45) Date of Patent: Mar. 29, 2022

(54) LIGHT-EMITTING DEVICE AND DISPLAY DEVICE

(71) Applicant: SHARP KABUSHIKI KAISHA, Sakai (JP)

(72) Inventors: Tsuyoshi Ono, Sakai (JP); Hiroaki Onuma, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 41 days.

(21) Appl. No.: 16/812,247

(22) Filed: Mar. 6, 2020

(65) Prior Publication Data

US 2020/0295238 A1 Sep. 17, 2020

Related U.S. Application Data

(60) Provisional application No. 62/818,725, filed on Mar. 14, 2019.

(51) Int. Cl.
| | |
|---|---|
| *H01L 33/50* | (2010.01) |
| *H01L 33/44* | (2010.01) |
| *H01L 33/36* | (2010.01) |
| *H01L 27/15* | (2006.01) |
| *G09G 3/32* | (2016.01) |

(52) U.S. Cl.
CPC ............ *H01L 33/504* (2013.01); *G09G 3/32* (2013.01); *H01L 27/153* (2013.01); *H01L 33/36* (2013.01); *H01L 33/44* (2013.01); *H01L 33/505* (2013.01); *G09G 2300/0408* (2013.01)

(58) Field of Classification Search
CPC ....... H01L 33/504; H01L 33/36; H01L 33/44; H01L 33/505; H01L 27/153
See application file for complete search history.

(56) References Cited

U.S. PATENT DOCUMENTS

| | | | |
|---|---|---|---|
| 2004/0233352 A1* | 11/2004 | Chen ................. | G02F 1/136209 349/106 |
| 2015/0116621 A1* | 4/2015 | Park .................... | G02F 1/13394 349/43 |
| 2017/0236464 A1* | 8/2017 | Koshihara ............ | G09G 3/2003 345/694 |
| 2017/0343859 A1* | 11/2017 | Chen ................. | G02F 1/133514 |
| 2018/0158882 A1 | 6/2018 | Kim et al. | |

FOREIGN PATENT DOCUMENTS

| | | |
|---|---|---|
| JP | H09-311216 A | 12/1997 |
| JP | H11-264969 A | 9/1999 |
| JP | 2018-092921 A | 6/2018 |

* cited by examiner

*Primary Examiner* — Mark W Tornow
(74) *Attorney, Agent, or Firm* — ScienBiziP, P.C.

(57) ABSTRACT

A light-emitting device having four or more LEDs arranged on a substrate includes a first color conversion layer and a second color conversion layer. The first color conversion layer is continuously formed on light exit surfaces of two or more of the LEDs, and the second color conversion layer is continuously formed on light exit surfaces of two or more of the LEDs that are different from the LEDs on which the first color conversion layer is formed.

7 Claims, 9 Drawing Sheets

LIGHT-EMITTING DEVICE AND DISPLAY DEVICE

TECHNICAL FIELD

The present invention relates to a light-emitting device and a display device.

BACKGROUND ART

Conventionally, there have been known a light-emitting device and a display device each including a plurality of pixels. A conventional light-emitting device has pixels each constituted by three types of subpixel, namely a red display subpixel, a green display subpixel, and a blue display subpixel, and a plurality of subpixels of each of these three types are arranged in one direction. Each of the subpixels is constituted by a light-emitting element having a light exit surface on which a color conversion layer is disposed (see, for example, PTL 1).

Further, there has been known a technology with which to maximize pixels by having pixels each constituted by first to fourth subpixels and placing the fourth subpixel between two adjoining ones of the first to third subpixels (see, for example, PTL 2). Furthermore, there has been known a technology with which to maximize light-emitting areas by connecting color conversion layers of two adjacent subpixels (that display the same color) and thereby linearizing the color conversion layers (see, for example, PTL 3).

CITATION LIST

Patent Literature

PTL 1 Japanese Unexamined Patent Application Publication No. 11-264969 (published on Sep. 28, 1999)
PTL 2 Japanese Unexamined Patent Application Publication No. 2018-92921 (published on Jun. 14, 2018)
PTL 3 Japanese Unexamined Patent Application Publication No. 9-311216 (published on Dec. 2, 1997)

SUMMARY OF INVENTION

Technical Problem

In recent years, there has been a growing demand for high-definition (e.g. 1000 ppi; a technology that is effective with a pixel size of 24 μm) image displays on display devices, and there has been a greater demand for smaller pixels. Note here that in a case of making pixels smaller in the display devices disclosed in PTLs 1 and 2, it is necessary to make each subpixel and, by extension, each color conversion layer smaller, as these light-emitting devices or the like have subpixels each including a single color conversion layer. However, making a color conversion layer smaller causes a substrate and a light-emitting element to have smaller areas of contact with the color conversion layer.

Further, making a color conversion layer smaller leads to a greater demand for the dimensional accuracy of the width of the color conversion layer and the positional accuracy of the color conversion layer with respect to a light-emitting element, making processing of the color conversion layer difficult. For these reasons, the problems Involving the adhesion and processability of a color conversion layer have made it difficult to meet the demand for high-definition image displays with the display devices disclosed in PTLs 1 and 2.

Meanwhile, a color filter for use in a liquid crystal panel disclosed in PTL 3 secures the areas of contact even with smaller pixels and does not suffer from the adhesion problem, as the color conversion layers are continuously formed in a line. However, making the pixels smaller in the color filter structurally causes two adjacent color conversion layers to adjoin each other. In this case, there has still been a problem involving processability, as even slight errors in dimension of the width of a color conversion layer and position of a color conversion layer with respect to a light-emitting element cause the two color conversion layers to unintentionally overlap each other.

One aspect of the present invention was made in view of the foregoing problems and has as an object to achieve a light-emitting device and the like that can be easily manufactured and that are capable of high-definition image displays.

Solution to Problem (1) One embodiment of the present invention is directed to a light-emitting device having four or more light-emitting elements arranged on a substrate, the light-emitting device including: at least two types of color conversion layers, formed on light exit surfaces of the light-emitting elements, that convert wavelengths of light emitted from the light-emitting elements, wherein the at least two types of the color conversion layers include a predetermined type of the color conversion layer continuously formed on the light exit surfaces of two or more of the light-emitting elements, and a different type of the color conversion layer continuously formed on the light exit surfaces of two or more of the light-emitting elements that are different from the limit-emitting elements on which the predetermined type of the color conversion layer is formed.

(2) Further, an embodiment of the present invention is directed to the light-emitting device according to the configuration (1) described above, wherein the predetermined type of the color conversion layer is continuously formed on the light exit, surfaces of two or more of the light-emitting elements arranged in a column-wise direction, and the different type of the color conversion layer is continuously formed on the light exit surfaces of two or more of the light-emitting elements arranged in a row-wise direction.

(3) Further, an embodiment of the present invention is directed to the light-emitting device according to the configuration (2) described above, further including a stacked portion in which a part of the color conversion layer of the predetermined type and a part of the color conversion layer of the different type overlap each other.

(4) Further, an embodiment of the present invention is directed to the light-emitting device according to the configuration (3) described above, wherein as for light emitted from the light exit surfaces of the light-emitting elements, an emission intensity of the light after transmission through the stacked portion is 50% or lower of an emission intensity of the light before transmission through the stacked portion.

(5) Further, an embodiment of the present invention is directed to the light-emitting device according to the configuration (3) or (4) described above, wherein the light-emitting elements include a light-emitting element placed in a place on the substrate located directly below the stacked portion.

(6) Further, an embodiment of the present invention is directed to the light-emitting device according to any one of the configurations (1) to (5) described above, wherein the light-emitting elements are LEDs.

(7) Further, an embodiment of the present invention is directed to the light-emitting device according to the configuration (6) described above, further including a stacked portion in which a part of the color conversion layer of the predetermined type and a part of the color conversion layer of the different type overlap each other, wherein the LEDs include an LED having its cathode electrode placed directly below the stacked portion.

(8) Further, an embodiment of the present invention is directed to a display device including: the light-emitting device according to any one of the configurations (1) to (7) described above; and a drive circuit that controls emission of light from the four or more light-emitting elements of the light-emitting device.

Advantageous Effects of Invention

One aspect of the present invention makes it possible to achieve a light-emitting device and the like that can be easily manufactured and that are capable of high-definition image displays.

BRIEF DESCRIPTION OF DRAWINGS

FIG. 6(a) to (c) of FIG. 6 are schematic views showing cross-section structures of the light-emitting device as taken along planes orthogonal to the substrate in a case where the color conversion layers have their side walls formed by a reflective material or the like.

DESCRIPTION OF EMBODIMENTS

An embodiment of the present invention is described below in detail. For convenience of explanation, members having the same functions as those described earlier are given the same signs, and a description thereof may be omitted. Further, FIGS. 1, 3, 7, and 8 assume that the vertical direction as seen from the front of the paper is a column-wise direction (direction in which columns extend) and the horizontal direction as seen from the front of the paper is a row-wise direction (direction in which rows extend).

[Concrete Configuration of Display Device]

Figure 1:
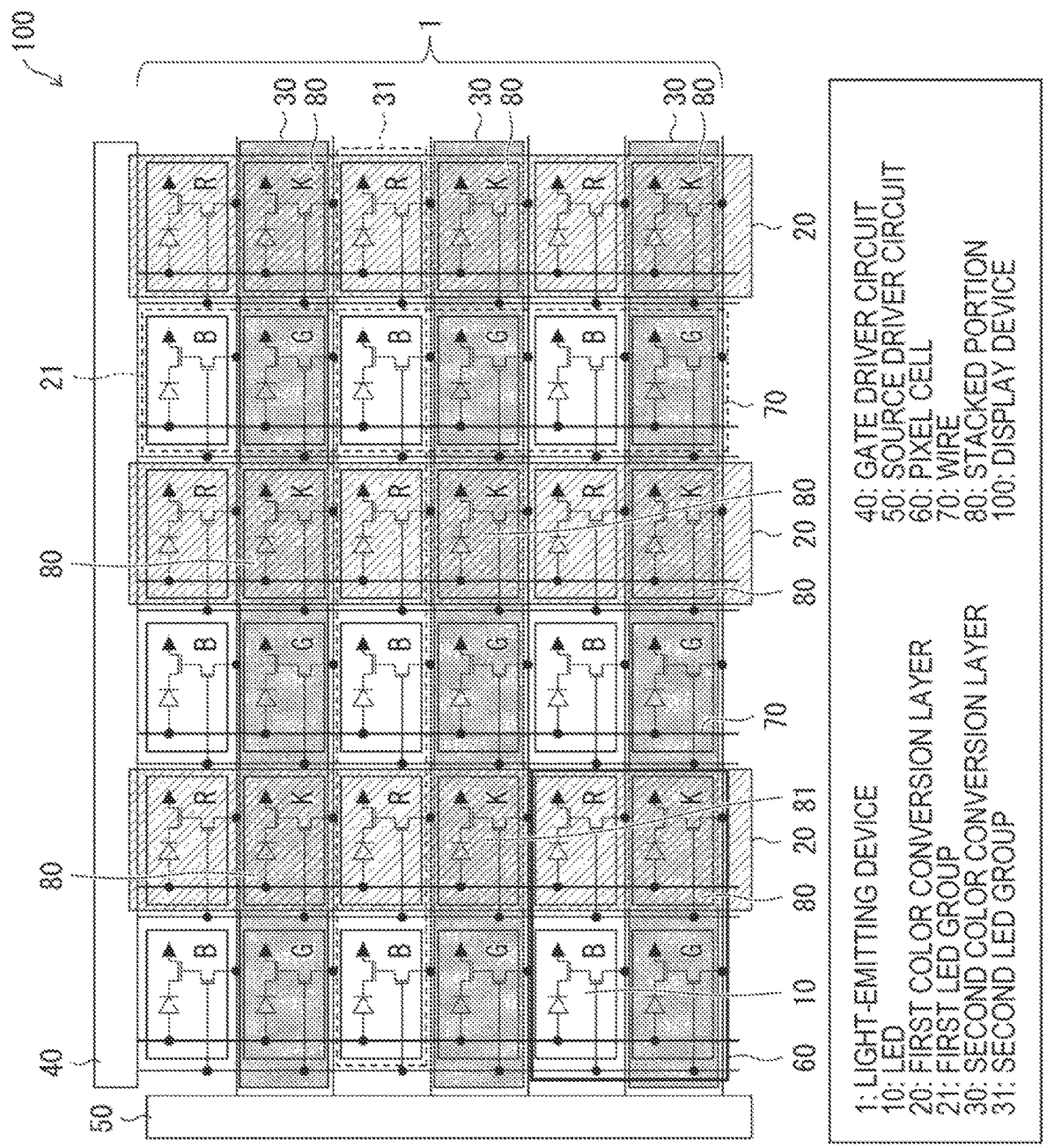
FIG. 1 is a circuit diagram showing a display device according to an embodiment of the present, invention.

As shown in FIG. 1, a display device 100 includes a light-emitting device 1, a gate driver circuit (drive circuit) 40, and a source driver circuit (drive circuit) 50. Further, as shown in FIG. 1, the light-emitting device 1 includes a substrate (not illustrated), LEDs (light-emitting diodes: light-emitting elements) 10, pixel drive circuits that drive the LEDs 10, first color conversion layers (predetermined type of color conversion layer) 20, and second conversion layers (different type of color conversion layer) 30. It should be noted that the pixel drive circuits refer to two transistors contained in each subpixel (which will be described in detail later) shown in FIGS. 1, 7, and 8.

<Light-Emitting Device>

The light-emitting device 1 has an array of the LEDs 10 arranged m rows and n columns (where m and n are natural numbers) in a reticular pattern on the substrate. For convenience of explanation. FIG. 1 here takes an example in which the LEDs 10 are arranged in six rows and six columns in a reticular pattern on the substrate. The same applies to FIGS. 2 to 9.

In the array, the LEDs 10 are placed at regular spacings (equal pitches). Specifically, two adjacent LEDs 10 are placed at the same distance from each other. It should be noted that it is not essential that in the array, the LEDs 10 are placed at regular spacings. For example, two adjacent LEDs 10 may be placed at different distances from each other.

<Substrate, Gate Driver Circuit, and Source Driver Circuit>

The substrate used is one that has wires 70 formed so that at least a surface of the substrate can be connected to the LEDs 10. The substrate may be made of a material such as silicon, germanium, silicon carbide, or an Tn—Ga—zn—O material. Further, the substrate may be a single-layer structure or may be a stack structure.

The substrate includes the gate driver circuit 40 and the source driver circuit 50, Specifically, the gate driver circuit 40 and the source driver circuit 50 are placed on an upper surface of the substrate in such a manner as to surround the light-emitting device 1. It should be noted that the placement of the gate driver circuit 40 and the source driver circuit 50 is merely an example and another placement may be employed.

The gate driver circuit 40 and the source driver circuit 50 control, through the pixel drive circuits, the turning on and turning off of all of the LEDs 10 (thirty-six LEDs 10) of the light-emitting device 1. In other words, the gate driver circuit 40 and the source driver circuit 50 control the emission of light from all of the LEDs 10 of the light-emitting device 1. It should be noted that the gate driver circuit 40 and the source driver circuit 50 may collectively control all of the LEDs 10 of the light-emitting device 1 or may individually control each of the LEDs 10 of the light-emitting device 1.

<LED>

The LEDs 10 are light-emitting elements, and LEDs that emit blue light are used. An example of an LED that emits blue light, may be an LED in which a p-type GaN layer, an InGaN layer, and an n-type GaN layer having a light exit surface (see FIG. 5) are arranged in this order. Alternatively, the LEDs 10 may be replaced, for example, by blue lasers or light-emitting elements that emit ultraviolet light. In a case of using light-emitting elements that emit ultraviolet light, color conversion layers (such as the after-mentioned phosphor layers or color filters) need to be placed on light exit surfaces of the light-emitting elements to convert ultraviolet light into blue light.

Furthermore, LEDs or the like that emit a color of light other than blue light may be used. Light-emitting elements that emit a color of light other than blue light include white light-emitting elements, and for example, organic LEDs in which red, green, and blue light-emitting layers are stacked on top of each other may be used.

The m×n LEDs 10 arranged in a reticular pattern on the substrate may be connected to the gate driver circuit 40 and the source driver circuit 50 via the pixel drive circuits and the wires 70. The size of each of the LEDs 10 and the distance between two adjacent LEDs 10 (hereinafter "LED spacing") are determined according to the device sizes required of the display device 100 and the light-emitting device 1 and the resolution of display images.

<First Color Conversion Layer and Second Color Conversion Layer>

The first color conversion layers 20 and the second color conversion layers 30 make contact with light exit surfaces 10*a* (see FIG. 5) of the LEDs 10 and convert the wavelengths of light emitted from the light exit surfaces 10*a*. Specifically, the first color conversion layers 20 are red color conversion layers that emit, red light by converting the wavelengths of light emitted from the light exit surfaces 10*a* or layers each having a red color filter on a color conversion layer including red. The second color conversion layers 30 are green color conversion layers that emit green light by converting the wavelengths of light emitted from the light exit surfaces 10*a* or layers each having a green color filter on a color conversion layer including green.

The first color conversion layers 20 may for example be red phosphor layers each containing a red phosphor or be quantum-dot phosphors that emit red light. Alternatively, for example, the first color conversion layers 20 may be ones each of which has a red color filter disposed on an upper surface of a yellow phosphor layer containing a yellow phosphor. Similarly, the second color conversion layers 30 may for example be green phosphor layers each containing a green phosphor or be quantum-dot phosphors that emit green light. Alternatively, for example, the second color conversion layers 30 may be ones each of which has a green color filter disposed on an upper surface of a yellow phosphor layer.

As mentioned before, in a case where the first color conversion layers 20 and the second color conversion layers 30 are each structured such that a color filter is disposed on an upper surface of a phosphor layer, the first color conversion layers 20 and the second color conversion layers 30 have the following cross-section structures.

First, cross-sections of second and third subpixels in a given pixel cell 60 (which will be described in detail later) as taken along a row-wise plane orthogonal to the substrate are structured as shown in (a) of FIG. 2. As shown in (a) of FIG. 2, the space between adjacent subpixels is filled with a filler 90. Further, the light exit surfaces 10*a* of LEDs 10 of each separate subpixel and a second phosphor layer 30*a* of a second color conversion layer 30 are in contact with each other, and an upper surface of the second phosphor layer 30*a* and a second color filter 30*b* of the second color conversion layer 30 are in contact with each other.

Furthermore, an upper surface of the second color filter 30*b* and a first phosphor layer 20*a* of a first color conversion layer 20 are in contact with each other, and an upper surface of the first phosphor layer 20*a* and a first color filter 20*b* of the first color conversion layer 20 are in contact with each other. Alternatively, the light exit surfaces 10*a* of LEDs 10 of each separate subpixel and first color conversion layers 20 may be in contact with each other and upper surfaces of the first color conversion layers 20 and a second color conversion layer 30 may be in contact with each other.

Figure 2:
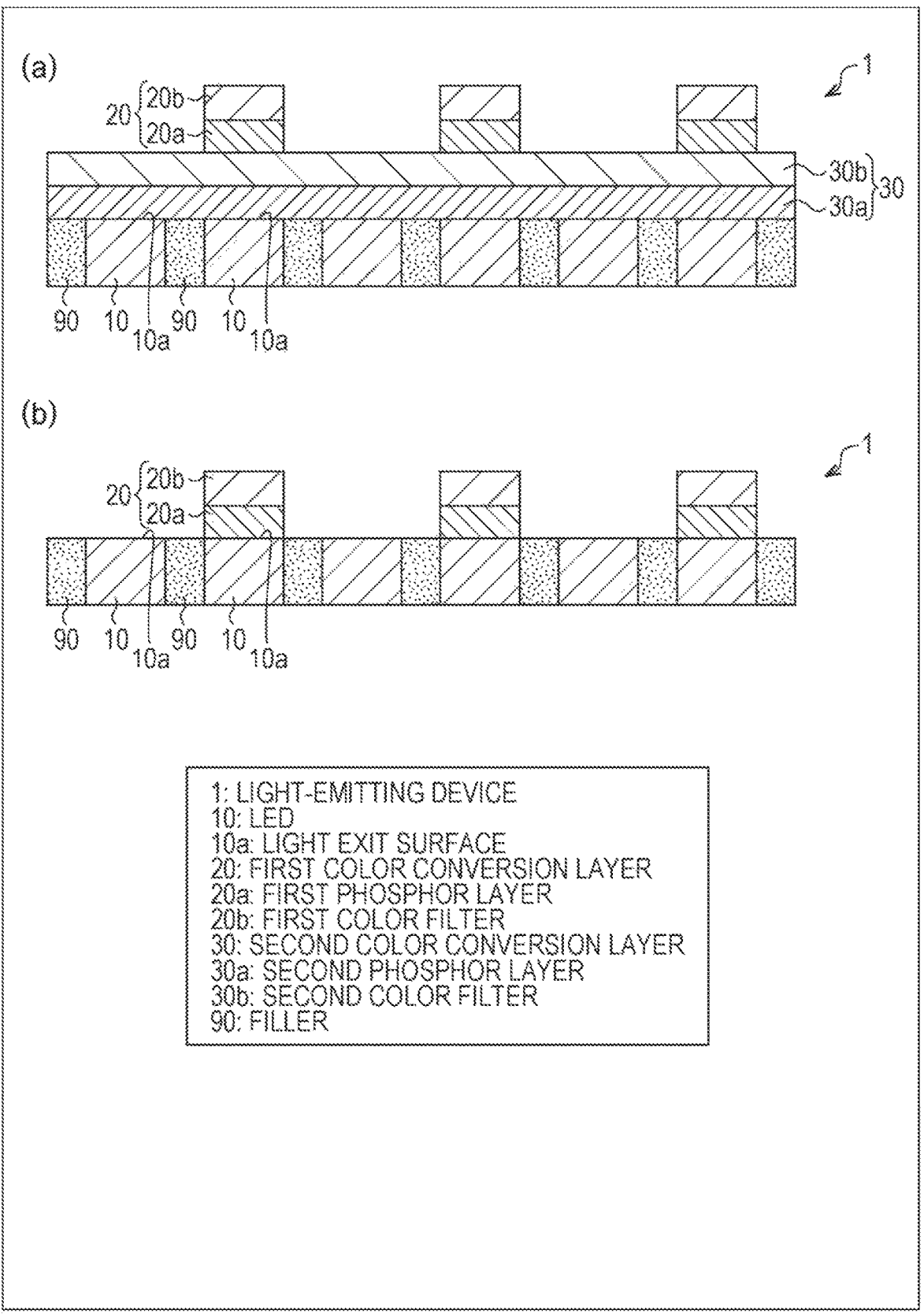
FIG. 2(a) and (b) of FIG. 2 are schematic views showing cross-section structures of a light-emitting device according to the embodiment of the present invention as taken along planes orthogonal to a substrate in a case where color conversion layers of the light-emitting device are each structured such that a color filter is disposed on an upper surface of a phosphor layer.
Figure 3:
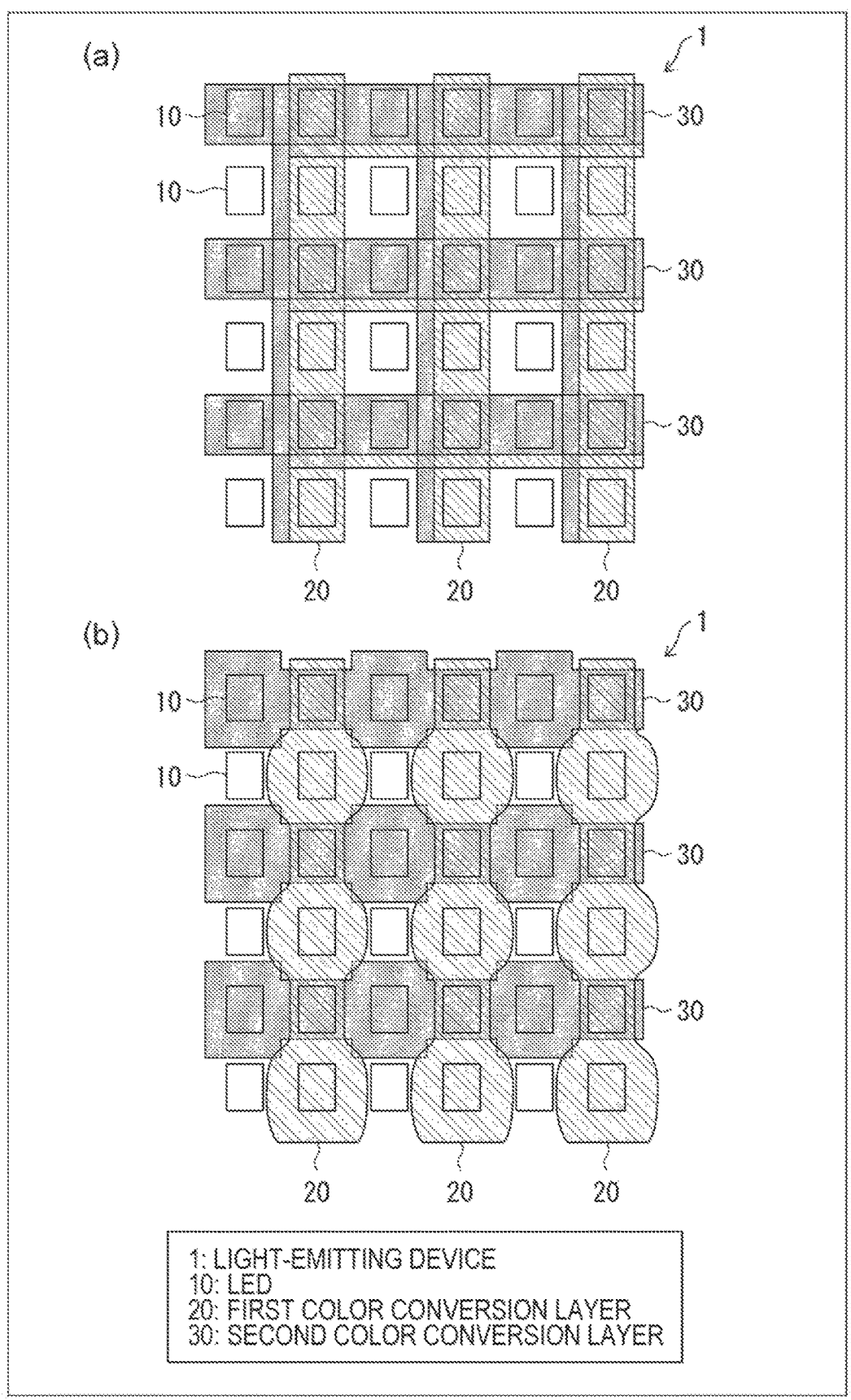
FIG. 3(a) and (b) of FIG. 3 are schematic views showing variations in the shape of the color conversion layers in top view.

Next, cross-sections of first and fourth subpixels in a given pixel cell 60 as taken along a row-wise plane orthogonal to the substrate are structured as shown in (b) of FIG. 2. As shown in (b) of FIG. 2, the space between adjacent subpixels is filled with a filler 90. Further, the light exit surfaces 10*a* of LEDs 10 of each separate first subpixel and first phosphor layers 20*a* of first color conversion layers 20 are in contact with each other, and upper surfaces of the first phosphor layers 20*a* and first color filters 20*b* of the first color conversion layers 20 are in contact with each other.

In a case where a color filter is disposed on an upper surface of a yellow phosphor layer, the first, color conversion layers 20 and the second color conversion layers 30 contain two types of color conversion layer. The color filter may be replaced by a light-absorbing material such as a pigment that is used in a color resist for use in an image sensor. Causing a color conversion layer to contain a light-absorbing material such as a color filter in addition to a phosphor makes it possible to more finely control a light spectrum.

The first color conversion layers 20 and the second color conversion layers 30 may each be formed by kneading epoxy resin, silicon resin, and acrylic resin with a phosphor or may be formed by kneading a resist material with a phosphor. Each of the aforementioned resins and the resist serve to retain the phosphors in the first color conversion layers 20 and the second color conversion layers 30.

Alternatively, the first color conversion layers 20 may be color conversion layers that emit light of a color that is different, from red, and the second color conversion layers 30 may be color conversion layers that emit light of a color that is different from green. Furthermore, a color conversion layer having a mixture of a green phosphor and a red phosphor may be used, or separate color conversion layers may each be configured by causing a color conversion layer to contain a color-absorbing material as well as a phosphor.

As shown in FIG. 1, the first color conversion layers 20 are each a rectangular and thin-plate member extending in a column-wise direction in top view and continuously formed into contact with the light exit surfaces 10*a* of m (six) LEDs 10 arranged in a column-wise direction. The second color conversion layers 30 are each a rectangular and thin-plate member extending in a row-wise direction in top view and continuously formed into contact with the light exit surfaces 10*a* of n (six) LEDs 10 arranged in a row-wise direction.

The first color conversion layers 20 and the second color conversion layers 30 are not limited in shape to the aforementioned shapes. The first color conversion layers 20 and the second color conversion layers 30 may for example be circular cylindrical, polygonal columnar, truncated conical, truncated pyramidal, and spherical in shape. Further, for example, the first color conversion layers 20 and the second color conversion layers 30 may have cross-sectional corrugated shapes in which pluralities of projections that are circular cylindrical, polygonal columnar, truncated conical, truncated pyramidal, and spherical in shape are arranged on the surfaces. Furthermore, the first color conversion layers 20 and the second color conversion layers 30 may be circular arc or polygonal in cross-sectional shape. Employing these shapes allows more components of light to be emitted in the direction that is directly above the LEDs 10.

Further, improvement in efficiency of light extraction and proper control of photo-alignment properties may be achieved by using a combination of color conversion layers of various shapes. Furthermore, the first color conversion layers 20 and the second color conversion layers 30 are not limited in shape to rectangles in top view. For example, when seen in top view, the first color conversion layers 20 and the second color conversion layers 30 may be have corrugated shapes or wavy shapes on the longer sides as shown in (a) of FIG. 3, or as shown in (b) of FIG. 3, identical color conversion layers adjoining each other may be connected in a ladder pattern. Employing these shapes can lead to more areas of contact and a higher degree of adhesion.

It is preferable that the first color conversion layers 20 and the second color conversion layers 30 contain high concentrations of phosphors (and light-absorbing materials). This is because higher concentrations of the phosphors (and light-absorbing materials) can make the first color conversion layers 20 and the second color conversion layers 30 thinner in thickness. Decreases in thickness of the first color conversion layers 20 and the second color conversion layers 30 cause fewer components of light to be emitted to neighboring first and second color conversion layers 20 and 30, thus making it possible to reduce mixtures of light that is emitted from individual first and second color conversion layers 20 and 30.

Further, there may be a case where gradients of concentration of phosphors (and light-absorbing materials) are present in the first color conversion layers 20 and the second color conversion layers 30. In this case, high concentrations of phosphors (and light-absorbing materials) on lower surfaces of the first and second color conversion layers 20 and 30 result in shorter heat dissipation paths to the LEDs 10. This brings about improvement in radiation performance of heat that is emitted from phosphors (and light-absorbing materials) along with color conversions, thus making it possible to enhance the color conversion performance of the phosphors (and light-absorbing materials).

As shown in FIG. 1, the first color conversion layers 20 are placed at intervals of a first LED group (first light-emitting element groups) 21 constituted by m LEDs 10 (two or more light-emitting elements) arranged in a column-wise direction. Further, the second color conversion layers 30 are placed at intervals of a second LED group (second light-emitting element groups) 31 constituted by n LEDs 10 (two or more light-emitting elements) arranged in a row-wise direction.

Specifically, the first color conversion layers 20 are placed in contact with the light exit surfaces 10a of m LEDs 10 included in each of n/2 (three) nan-adjacent first LED groups 21 of n first LED groups 21. Further, the second color conversion layers 30 are placed in contact with the light exit surfaces 10a of n LEDs 10 included in each of m/2 (three) non-adjacent second LED groups 31 of m second LED groups 31.

That is, the first color conversion layers 20 and the second color conversion layers 30 are arranged so that n/2 first color conversion layers 20 and m/2 second color conversion layers 30 are substantially orthogonal to each other in top view. At this point in time, two adjacent first color conversion layers 20 are placed at a spacing that is equal to or greater than the row-wise width of each LED 10 and that is narrower than the sum of the row-wise width of each LED 10 and a value obtained by doubling a row-wise LED spacing. Further, two adjacent second color conversion layers 30 are placed at a spacing that is wider than the column-wise width of each LED 10 and that is narrower than the sum of the column-wise width of each LED 10 and a value obtained by doubling a column-wise LED spacing.

The first and second color conversion layers 20 and 30 thus arranged have the following cross-section structures. First, cross-sections of second and third subpixels in a given pixel cell 60 (which will be described in detail later) as taken along a row-wise plane orthogonal to the substrate are structured as shown in (a) of FIG. 1. As shown in (a) of FIG. 4, the space between adjacent subpixels is filled with a filler 90. Further, the light exit surfaces 10a of LEDs 10 of each separate subpixel and a second color conversion layer 30 are in contact with each other. Furthermore, an upper surface of the second color conversion layer 30 and a first color conversion layer 20 are in contact with each other. Alternatively, the light exit surfaces 10a of LEDs 10 of each separate subpixel and first color conversion layers 20 may be in contact with each other, and upper surfaces of the first color conversion layers 20 and a second color conversion layer 30 may be in contact with each other.

Figure 4:
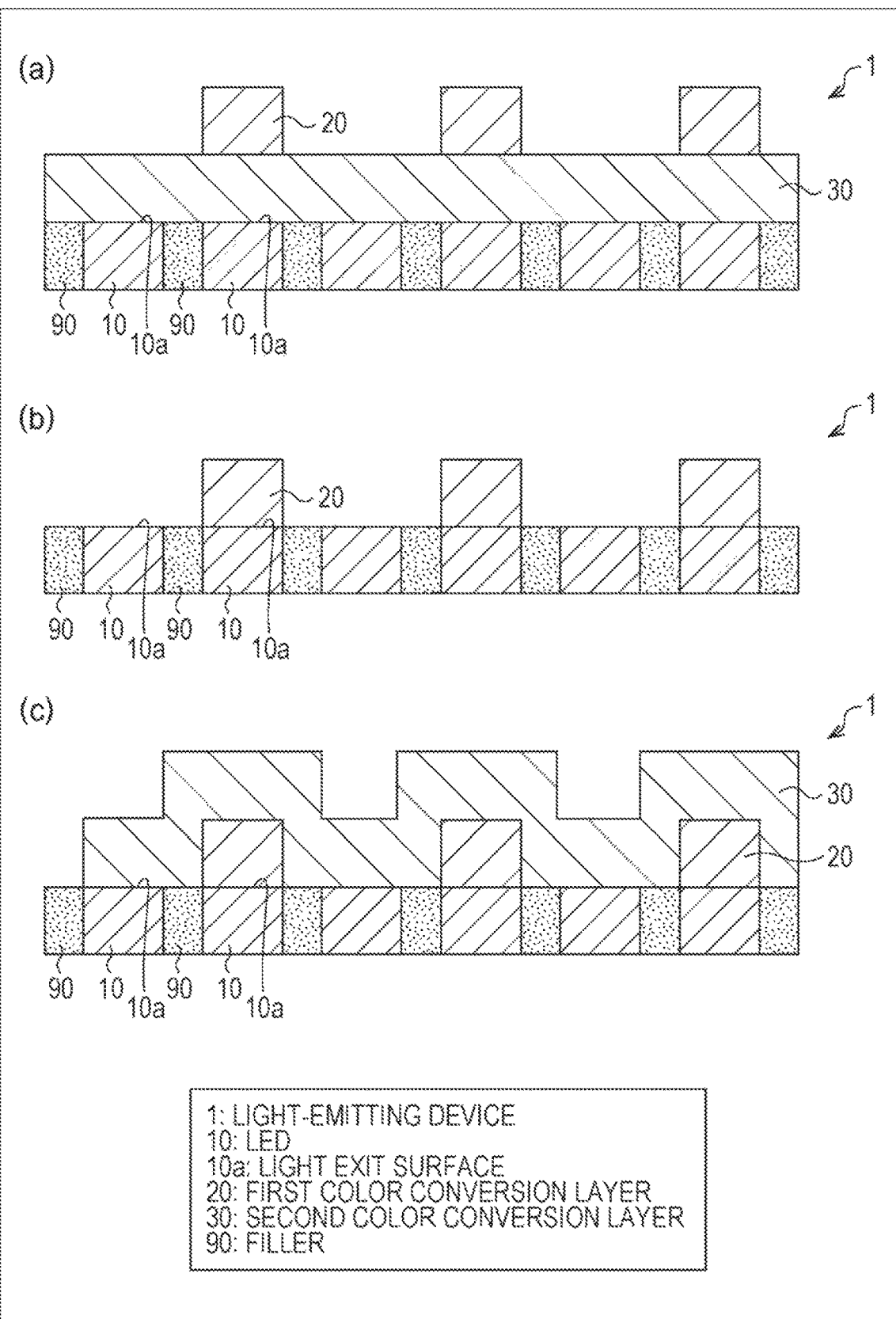
FIG. 4(a) to (c) of FIG. 3 are schematic views showing cross-section structures of the light-emitting device as taken along planes orthogonal to the substrate.

Next, cross-sections of first and fourth subpixels in a given pixel cell 60 as taken along a row-wise plane orthogonal to the substrate are structured as shown in (b) of FIG. 4. As shown in (b) of FIG. 4, the space between adjacent subpixels is filled with a filler 90. Further, the light exit surfaces 10a of LEDs 10 of each separate first subpixel and first, color conversion layers 20 are in contact with each other.

Next, cross-sections of first and third subpixels in a given pixel cell 60 as taken along a column-wise plane orthogonal to the substrate are structured as shown in (c) of FIG. 4. As shown in (c) of FIG. 4, the space between adjacent subpixels is filled with a filler 90. Further, the light exit surfaces 10a of LEDs 10 of each separate third subpixel and a second color conversion layer 30 are in contact with each other. Furthermore, first color conversion layers 20 are in contact with the light exit surfaces 10a of LEDs of each separate first, subpixel, upper surfaces of fillers 90, and upper and side surfaces of three second color conversion layers 30 in such a manner as to cover each of the aforementioned surfaces.

The aforementioned arrangement of the first color conversion layers 20 and the second color conversion layers 30 allows two adjacent color conversion layers to be placed at a wider spacing. Since a certain amount of decrease in dimensional accuracy or the like in width of the first color conversion layers 20 and the second color conversion layers 30 no longer matters as much as the spacing becomes wider, it becomes possible to easily mold the first color conversion layers 20 and the second color conversion layers 30. This leaves molding untouched even with reductions in size of the first color conversion layers 20 and the second color conversion layers 30 and, by extension, makes it possible to easily manufacture a high-definition light-emitting device 1 and a high-definition display device 100 with reductions in size of the after-mentioned pixel cells 60.

Figure 5:
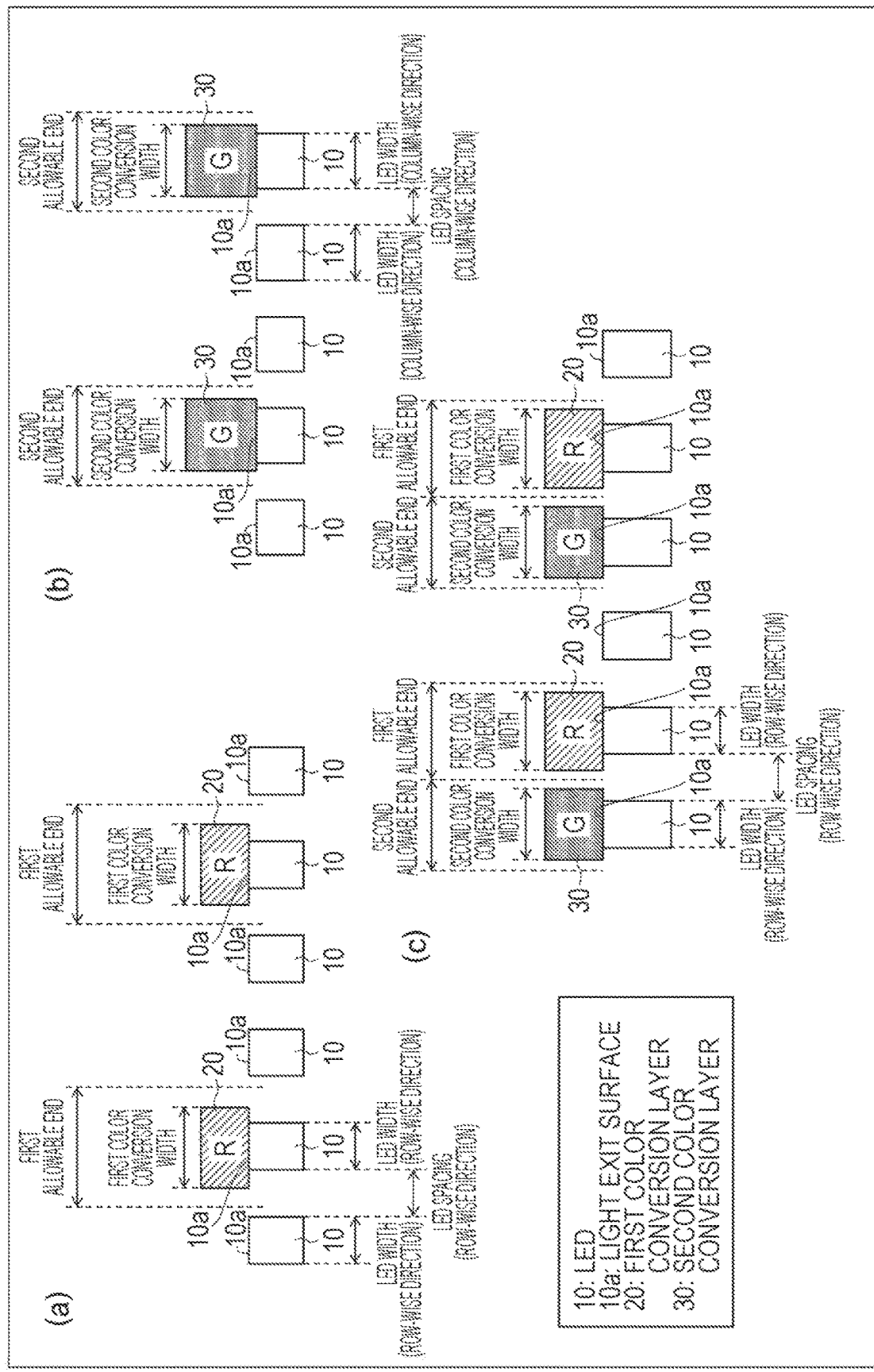
FIG. 5(a) of FIG. 5 is a schematic view showing an arrangement of first color conversion layers with respect to LEDs in side view of the light-emitting device, (b) of FIG. 5 is a schematic view showing an arrangement of second color conversion layers with respect to LEDs in side view of the light-emitting device, and (c) of FIG. 5 is a diagram showing an arrangement of first color conversion layers and second color conversion layers with respect to LEDs in side view of a conventional light-emitting device.

Specifically, as shown in (a) of FIG. 5, the first color conversion layers 20 need only be molded so that the row-wise width of each first color conversion layer 20 (in the drawing, "FIRST COLOR CONVERSION LAYER WIDTH") falls within a range from a length that is equal to the row-wise width of each LED 10 (in the drawing, "LED WIDTH (ROW-WISE DIRECTION)") to a length (in the drawing, "FIRST ALLOWABLE END") that is slightly narrower than the sum of the row-wise width of each LED 10 and a value obtained by doubling the row-wise LED spacing (in the drawing, "LED SPACING (ROW-WISE DIRECTION)").

Similarly, as shown in (b) of FIG. 5, the second color conversion layers 30 need only be molded so that the column-wise width of each second color conversion layer 30 (in the drawing, "SECOND COLOR CONVERSION LAYER WIDTH") falls within a range from a length that is equal to the column-wise width of each LED 10 (in the drawing, "LED WIDTH (COLUMN-WISE DIRECTION)") to a length (in the drawing, "SECOND ALLOWABLE END") that is slightly narrower than the sum of the column-wise width of each LED 10 and a value obtained by doubling the column-wise LED spacing (in the drawing, "LED SPACING (COLUMN-WISE DIRECTION)").

In a conventional light-emitting device, as shown in (c) of FIG. 5, the spacings between a first color conversion layer 20 and a second color conversion layer 30 that adjoin each other are much narrower than the spacings between two color conversion layers shown in (a) and (b) of FIG. 5. Therefore, in a case where at least either the first color conversion layer or the second color conversion layer is wider in width than a desired dimension, the first color conversion layer 20 and the second color conversion layer 30 cannot be arranged, as the first color conversion layer 20 and the second color conversion layer 30 interfere with each other. This shows that the arrangement of the first color conversion layers 20 and the second color conversion layers 30 in the light-emitting device 1 makes it possible to easily mold the first color conversion layers 20 and the second color conversion layers 30.

Further, such an arrangement of the first color conversion layers 20 and the second color conversion layers 30 causes the light-emitting device 1 to have LEDs 10 whose light exit surfaces 10a do not make contact with the first color conversion layers 20 or the second color conversion layers 30. Blue light that is emitted from these LEDs 10 is directly taken out as a blue display by the after-mentioned pixel cells 60, . . . , 62.

Figure 6:
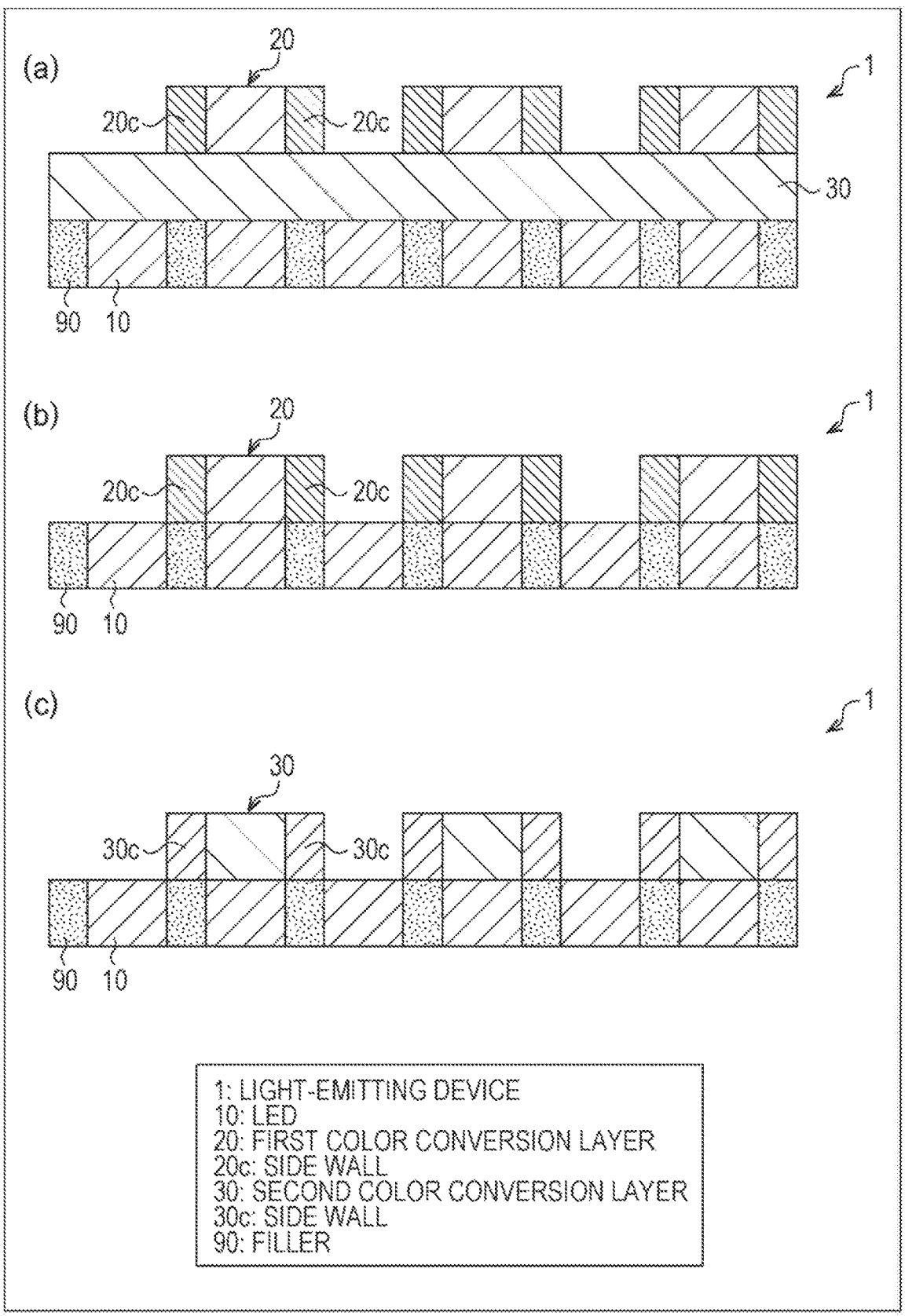

As shown in FIG. 6, the first color conversion layers 20 and/or the second color conversion layers 30 may have their side walls 20c and/or 30c, respectively, formed by a material that absorbs or reflects a particular or all wavelengths, (a) of FIG. 6 shows cross-section structures of second and third subpixels in a given pixel cell 60 (which will be described in detail later) as taken along a row-wise plane orthogonal to the substrate. Further, (b) of FIG. 6 shows cross-section structures of first and fourth subpixels in a given pixel cell 60 as taken along a row-wise plane orthogonal to the substrate. Furthermore, (c) of FIG. 6 shows cross-section structures of second and fourth subpixels in a given pixel cell 60 as taken along a column-wise plane orthogonal to the substrate.

The side walls 20c and the side walls 30c, too, can be easily processed, as a wide spacing can be secured between two adjacent color conversion layers. The formation of the side walls 20c and the side walls 30c by a material that absorbs or reflects a particular wavelength makes it possible to reduce leakage of light from the first color conversion layer 20 and the second color conversion layer 30 and protect (prevent the falling or peeling of) these two color conversion layers.

Further, as for an LED 10 whose light exit surface 10a does not make contact with a first color conversion layer 20 or a second color conversion layer 30, the purity of blue may be enhanced by separately placing, on the light exit surface 10a of this LED 10, a color conversion layer which is similar to that which is used in a color filter. Further, in a case where not an LED 10 but a light-emitting element that emits light (e.g. ultraviolet light) that is shorter in wavelength than blue light has its light exit surface out of contact with a first color conversion layer 20 or a second color conversion layer 30, a blue phosphor may be placed on the light exit, surface of the light-emitting element.

Furthermore, since the first color conversion layers 20 and the second color conversion layers 30 are substantially orthogonal to each other as mentioned above, the first color conversion layers 20 and the second color conversion layers 30 have stacked portions 80 in which parts of the first color conversion layers 20 and parts of the second color conversion layers 30 overlap each other as shown in FIG. 1. The stacked portions 80 attenuate blue light, contained in blue light emitted from LEDs 10 whose light exit surfaces 10a are not in contact with the stacked portions 80, that has leaked without being color-converted by first or second color conversion layers 20 or 30 that are in contact with the light exit, surfaces 10a of the LEDs 10. In other words, as for the leaked blue light, the stacked portions 80 have a function of causing the emission intensity of the light after transmission through the stacked portions 80 to be lower than the emission intensity of the leaked blue light before transmission through the stacked portions 80.

For example, in a case where the first color conversion layers 20 and the second color conversion layers 30 are phosphor layers, the leaked blue light can be attenuated to 50% or lower by the stacked portions 80. In other words, as for the leaked blue light, the emission intensity of the light after transmission through the stacked portions 80 can be decreased to 50% or lower of the emission intensity of the leaked blue light before transmission through the stacked portions 80.

Alternatively, in a case where the first color conversion layers 20 and the second color conversion layers 30 are layered structures in each of which a color filter is stacked on top of a phosphor layer, the leaked blue light can be attenuated to 10% or lower by the stacked portions 80. In other words, as for the leaked blue light, the emission intensity of the light after transmission through the stacked portions 80 can be decreased to 10% or lower of the emission intensity of the leaked blue light before transmission through the stacked portions 80.

<Pixel Cell>

As shown in FIG. 1, the pixel cell 60 includes four subpixels arranged in a reticular pattern on the substrate. The four subpixels consist of a first subpixel (subpixel indicated by "R" in the drawing) including a first color conversion layer 20 and an LED 10, a second subpixel (subpixel indicated by "G" in the drawing) including a second color conversion layer 30 and an LED 10, a third subpixel (subpixel indicated by "K" in the drawing) including a stacked portion 80 and an LED 10, and a fourth subpixel (subpixel indicated by "B" in the drawing) including an LED 10.

The first subpixel, the second subpixel, and the fourth subpixel are arranged in an L shape in top view, and the first subpixel, the second subpixel, and the fourth subpixel perform a red display, a green display, and a blue display, respectively, whereby the pixel cell 60 performs an RGB display.

In a case where the two color conversion layers of the stacked portion 80, namely the first color conversion layer 20 and the second color conversion layer 30, are phosphor layers, emission of blue light from the LED 10 of the third subpixel causes the third subpixel to perform a white display. In this case, the pixel cell 60 performs an RGBW display. On the other hand, in a case where the two color conversion layers are layered structures in each of which a color filter is stacked on top of a phosphor layer, emission of blue light from the LED 10 of the third subpixel causes the third subpixel to perform a black display.

It should be noted that the LED 10 of the third subpixel does not need to be used. In a case where the LED 10 of the third subpixel is not used, the pixel cell 60 performs an RGB display regardless of whether the first and second color conversion layers 20 and 30 of the stacked portion 80 are phosphor layers or layered structures in each of which a color filter is stacked on top of a phosphor layer.

[Modifications]

Figure 7:
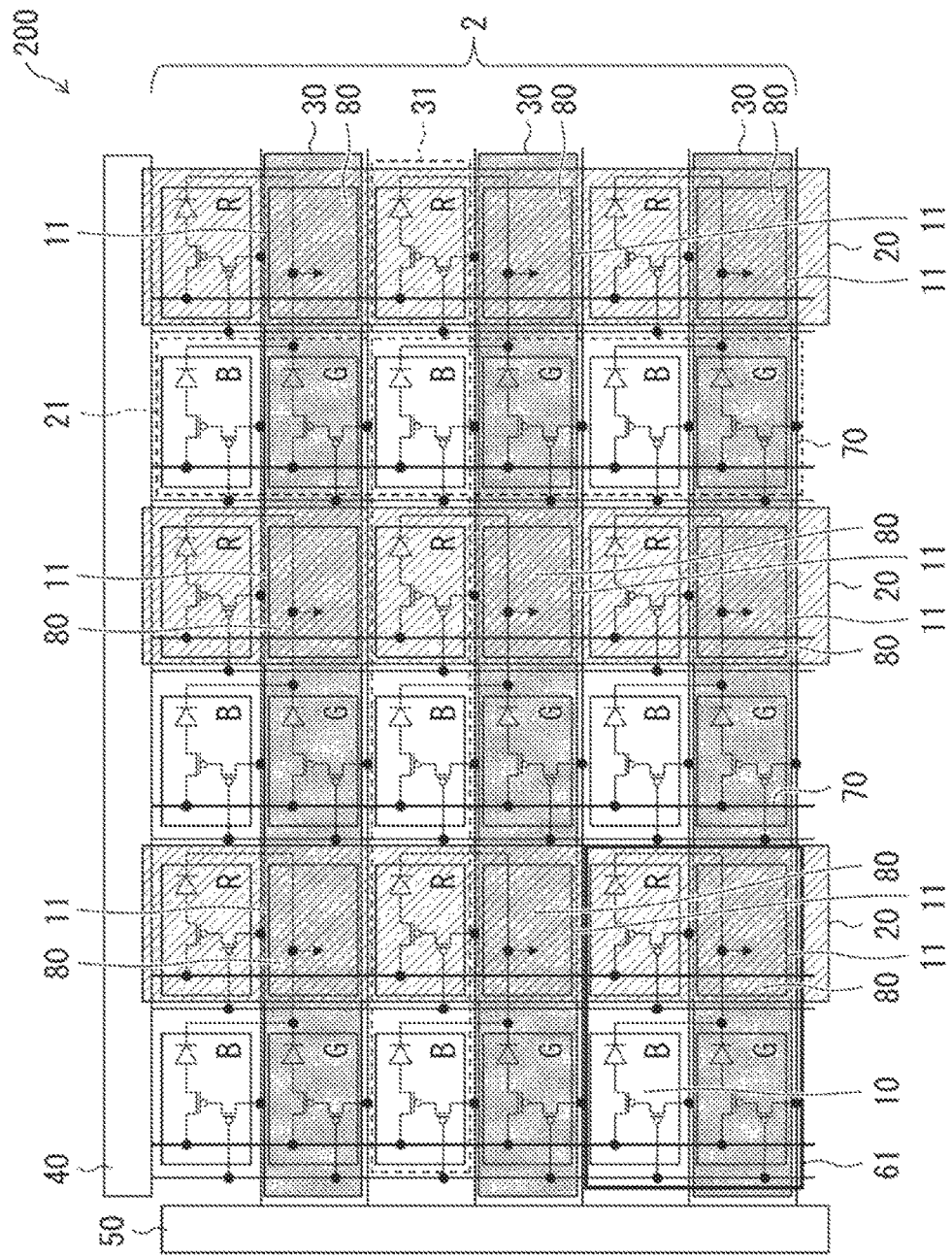
FIG. 7 is a circuit diagram showing an example of a modification of the display device.

There are a plurality of possible variations of the light-emitting device 1 and the display device 100 according to the embodiment of the present invention. First, as shown in FIG. 7, a light emitting device 2 and a display device 200 each having pixel cells 61 arranged in a reticular pattern on a substrate are possible variations of the light-emitting device 1 and the display device 100.

Each of the pixel cells 61 includes, in addition to a first subpixel, a second subpixel, and a fourth subpixel, a third subpixel having no LED 10 placed directly below the stacked portion 80. In this case, the third subpixel serves as a non-light-emitting unit 11 (i.e. a subpixel indicated by no alphabet in the drawing) that is physically incapable of performing a color display. Further, the pixel cell 61 performs an RGB display regardless of whether the first and second color conversion layers 20 and 30 of the stacked portion 80 are phosphor layers or layered structures in each of which a color filter is stacked on top of a phosphor layer.

Furthermore, the third subpixel may foe parts of the LEDs 10 located directly below the first subpixel, the second subpixel, and the fourth subpixel. Alternatively, the third subpixel may be a cathode electrode of an LED 10 that serves as a non-light-emitting unit. In this case, moreover, the third subpixel may be a common cathode electrode of a given LED 10.

Next, a third subpixel may be configured to perform a red display, a green display, or a blue display. Specifically, as shown in FIG. 8, a light-emitting device 3 and a display device 300 in each of which the first and second color conversion layers 20 and 30 of a stacked portion 80 included in a particular third subpixel have been reconstructed as different color conversion layers, too, are possible variations of the light-emitting device 1 and the display device 100.

For example, in a case where the first subpixel of a particular pixel cell 60 (see FIG. 1) fails for some reason and no longer emits light, the particular pixel cell 60 becomes unable to perform a red display. To address this problem, in order that a particular pixel cell 60 whose first subpixel has failed can perform a red display, the stacked portion 80 of the third subpixel of the particular pixel cell 60 is reconstructed.

Specifically, in a case where the first and second color conversion layers 20 and 30 of the stacked portion 80 of the third subpixel are each a layered structure in which a color filter is stacked on top of a phosphor layer, a green color filter can be removed from the stacked portion 80. Alternatively, the stacked portion 80 is totally removed, and instead of the stacked portion 80, a stack of a red color filter on top of a red phosphor layer is placed on the light exit surface 10*a* of the LED 10.

Figure 8:
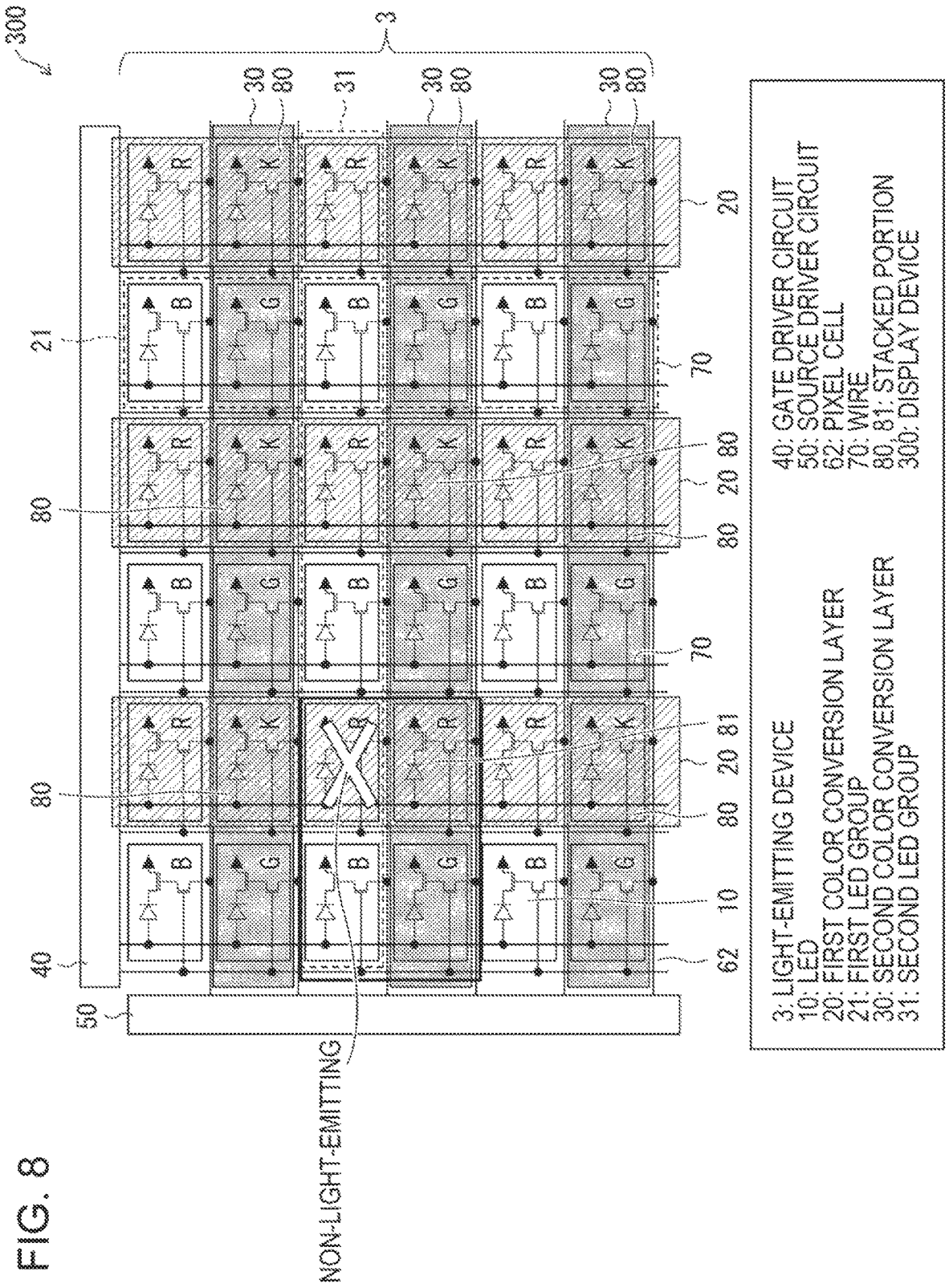
FIG. 8 is a circuit diagram showing another example of a modification of the display device.

Thus reconstructed, (i) a mixed layer of a first color conversion layer 20 (i.e. a stack of a color filter on top of a phosphor layer) and a green phosphor layer or (ii) a stack of a red color filter on top of a red phosphor layer serves as a stacked portion 81 shown in FIG. 8. Further, since the stacked portion 30 of the third subpixel has been reconstructed as the stacked portion 81, a pixel cell 62 shown in FIG. 8 can perform a red display regardless of failure in the first subpixel (i.e. the first subpixel indicated by "NON-LIGHT-EMITTING" in the drawing).

Further, for example, when the second subpixel of a particular pixel, cell 60 has failed, the stacked portion 80 of the third subpixel may be reconstructed as (i) a mixed layer of a red phosphor layer and a second color conversion layer 30 (i.e. a stack of a color filter on top of a phosphor layer) or (ii) a stack of a green color filter on top of a green phosphor layer). Furthermore, when the fourth subpixel of a particular pixel cell 60 has failed, the stacked portion 80 of the third subpixel may be totally removed.

As noted above, in a case where any of the first, second, and fourth subpixels no longer emits light, the stacked portion 80 of the third subpixel is reconstructed as mentioned above so that the third subpixel can be redundantly used as a substitute subpixel for the non-light-emitting subpixel.

Next, all or some of the light exit surfaces 10*a* of the LEDs 10 may be provided with a member formed by a material, such as a resist or resin, that reflects light of a particular wavelength. Specifically, as shown in FIG. 9, a light-emitting device 4 having a protective layer 12 disposed on all or some of the light exit surfaces 10*a* of the LEDs 10 and having first and second color conversion layers 20 and 30 in contact with an upper surface of the protective layer 12, too, is a possible variation of the light-emitting device 1.

Figure 9:
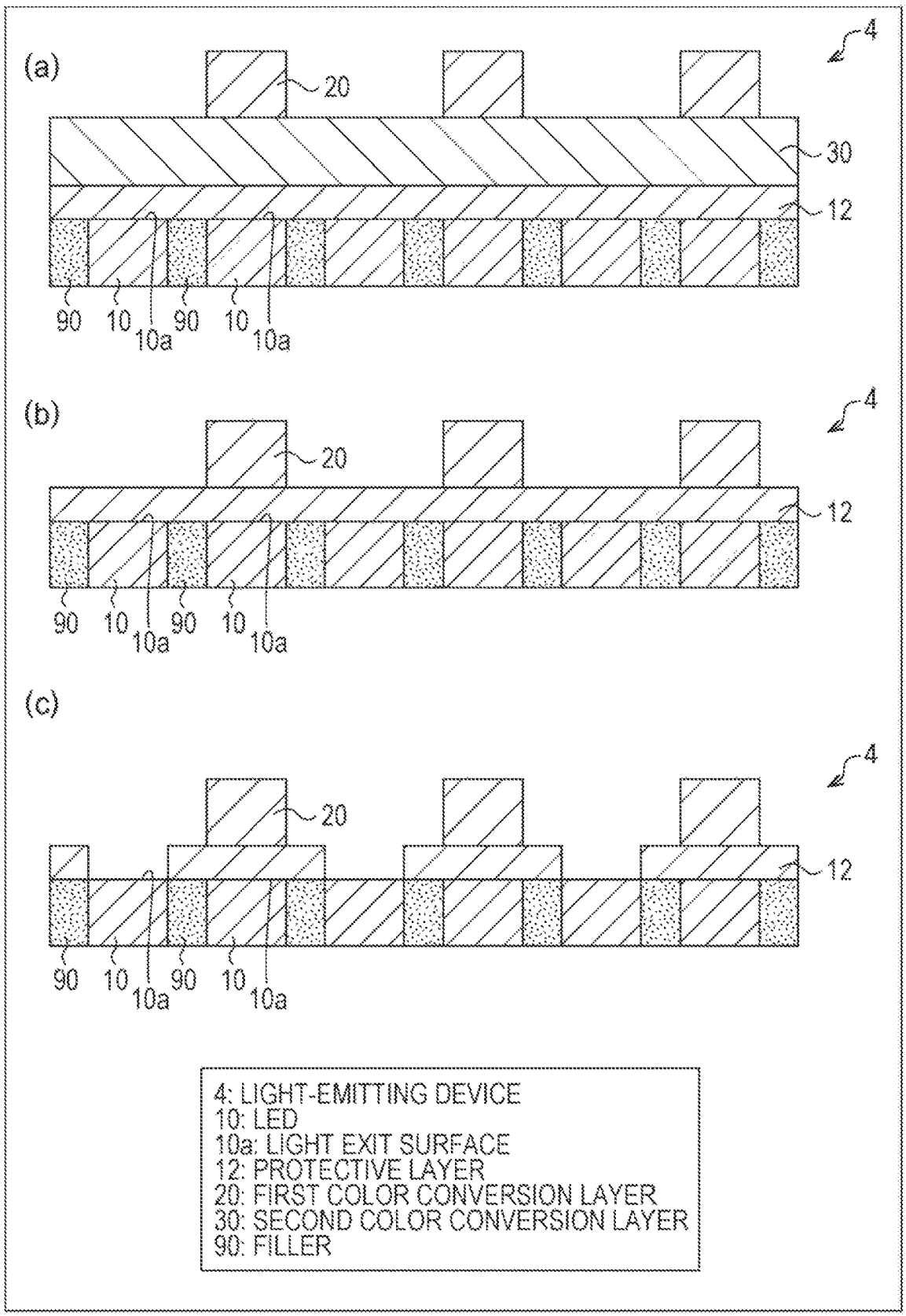
FIG. 9(a) to (c) of FIG. 9 are schematic views showing cross-section structures of the light-emitting device as taken along planes orthogonal to the substrate in another example of a modification of the display device.

In a case where the protective layer 12 is disposed on all of the light exit surfaces 10*a* of the LEDs 10, cross-sections of the second and third subpixels in a given pixel cell 60 (see FIG. 1) as taken along a row-wise plane orthogonal to the substrate are structured as shown in (a) of FIG. 9. Further, cross-sections of the first and fourth subpixels in a given pixel cell 60 as taken along a row-wise plane orthogonal to the substrate are structured as shown in (b) of FIG. 9.

In this case, for example, the protective layer 12 may be kneaded with a phosphor such as a yellow phosphor. In a case where the protective layer 12 is kneaded with a phosphor, no protective layer 12 is disposed on the light exit surfaces of the LEDs 10 included in the fourth subpixels, as shown in FIG. 9(*c*).

[Conclusion]

A light-emitting device (1, 2, 3) according to Aspect 1 of the present invention is a light-emitting device having three or more light-emitting elements (LEDs 10) arranged on a substrate, the light-emitting device including: at least two types of color conversion layers (first color conversion layer 20, second color conversion layer 30), formed on light exit surfaces (10*a*) of the light-emitting elements, that convert wavelengths of light emitted from the light-emitting elements, wherein the at least: two types of the color conversion layers include a predetermined type of the color conversion layer (first color conversion layer 20) continuously formed on the light exit surfaces of two or more of the light-emitting elements arranged in a column-wise direction, and a different type of the color conversion layer (second color conversion layer 30) continuously formed on the light exit surfaces of two or more of the light-emitting elements arranged in a row-wise direction.

According to the foregoing configuration, a single color conversion layer continuously formed makes contact with the light exit surfaces of at least two light-emitting elements arranged in a column-wise direction. Similarly, a single color conversion layer continuously formed makes contact with the light exit surfaces of at least two light-emitting elements arranged in a row-wise direction. Therefore, in comparison with a configuration in which a single color conversion layer is in contact with the light exit surface of each single light-emitting element, the substrate and the light-emitting elements have larger areas of contact with the color conversion layers. This makes it possible to enhance the adhesion of the color conversion layers.

Further, according to the foregoing configuration, color conversion layers of the predetermined type are placed at intervals of a first light-emitting group, and color conversion layers of the different type are placed at intervals of a second light-emitting element group, so that two adjacent color conversion layers are placed at a wider spacing. Therefore, in a case where there is a certain amount of dimensional error in width of the color conversion layers and a case where the accuracy of position of the color conversion layers with respect to the first and second light-emitting element groups is somewhat low, two adjacent color conversion layers do not unintentionally overlap each other. This makes it possible to mold and align the color conversion layers without being overly concerned about accuracy and makes it possible to enhance the processability of the color conversion layers.

For these reasons, even smaller pixels do not pose any problems for the adhesion or processability of the color conversion layers. This makes it possible to achieve a light-emitting element that can be easily manufactured and that is capable of a high-definition image display.

It should be noted that the color conversion layers may be applied directly to the light, exit surfaces of the light-emitting elements. Further, all or some of the light exit surfaces may be provided with a member formed by a material, such as a resist or resin, that reflects light of a particular wavelength, and the color conversion layers may be brought into contact with an upper surface of the member. This makes it possible to protect the surfaces of the light-emitting elements and makes it possible to further enhance the adhesion of the color conversion layers. Furthermore, the member formed by a resist, resin, or the like may be mixed with a phosphor or the like.

In Aspect 1, a light-emitting device according to Aspect 2 of the present invention may be configured to further Include a stacked portion (80) in which a part of the color conversion layer of the predetermined type and a part of the color conversion layer of the different type overlap each other.

According to the foregoing configuration, of light emitted from a light-emitting element whose light exit surface is not in contact with a stacked portion, light having leaked without passing through a color conversion layer that is in contact with the light exit surface of the light-emitting element can be attenuated by a stacked portion. This allows each pixel to display a color with higher accuracy of reproducibility.

In Aspect 2, a light-emitting device according to Aspect 3 of the present invention may be configured such that as for light emitted from the light exit surfaces of the light-emitting elements, an emission intensity of the light after transmission through the stacked portion is 50% or lower of an emission intensity of the light before transmission through the stacked portion.

According to the foregoing configuration, of light emitted from a light-emitting element whose light exit surface is not in contact with a stacked portion, light having leaked without passing through a color conversion layer that, is in contact with the light exit surface of the light-emitting element can be attenuated to 50% or lower by a stacked portion. This allows each pixel to display a color with even higher accuracy of reproducibility. For even higher color reproducibility, it is desirable that intensities of light, before and after passage through a color conversion layer be 5% or lower.

In Aspect 2 or 3, a light-emitting device according to Aspect 4 of the present invention may be configured such that the light-emitting elements include a light-emitting element placed in a place on the substrate located directly below the stacked portion. According to the foregoing configuration, for example, in a case where light-emitting elements that emit blue light are used and two types of color conversion layers, namely a color conversion layer formed solely by a red phosphor and a color conversion layer formed solely by a green phosphor, are used, emission of light from a light-emitting element located directly below the stacked portion causes white light to be emitted from the stacked portion. This makes an RGBW display possible and makes it possible to increase the luminance of a white display that is performed by a particular pixel.

In Aspect 1, a light-emitting device according to Aspect 5 of the present invention may be configured such that the light-emitting elements are LEDs. According to the foregoing configuration, a light-emitting device in which LEDs are used as light-emitting elements brings about effects which are similar to those brought about by the light-emitting device according to Aspect 1 of the present invention.

In Aspect 5, a light-emitting device according to Aspect 6 of the present invention may be configured to further include a stacked portion in which a part of the color conversion layer of the predetermined type and a part of the color conversion layer of the different type overlap each other, and the LEDs may include an LED having its cathode electrode placed directly below the stacked portion. According to the foregoing configuration, a light-emitting device in which an LED has its cathode electrode placed directly below a stacked portion brings about effects which are similar to those brought about by the light-emitting device according to Aspect 4 of the present invention.

A display device (100, 200, 300) according to Aspect 7 of the present invention includes: the light-emitting device according to Aspect 1; and a drive circuit (gate driver circuit 40, source driver circuit 50) that controls emission of light from the three or more light-emitting elements of the light-emitting device. The foregoing configuration brings about effects which are similar to those brought about by the light-emitting device according Aspect 1 of the present invention.

[Addition]

The present invention is not limited to any of the embodiments described above but may be altered in various ways within the scope of the claims, and an embodiment based on a proper combination of technical means disclosed in different embodiments is encompassed in the technical scope of the present invention. Furthermore, a new technical feature can be formed by a combination of technical means respectively disclosed in embodiments.

What is claimed is:

1. A light-emitting device having four or more light-emitting elements arranged on a substrate, the light-emitting device comprising:
   at least two types of color conversion layers, formed on light exit surfaces of the four or more light-emitting elements, to convert wavelengths of light emitted from the light-emitting elements, wherein the at least two types of the color conversion layers include:
a predetermined type of the color conversion layer continuously formed on the light exit surfaces of two or more of the four or more light-emitting elements, and
a different type of the color conversion layer continuously formed on the light exit surfaces of two or more of the four or more light-emitting elements that are different from the two or more limit-emitting elements on which the predetermined type of the color conversion layer is formed; and the light-emitting device further comprises:
a stacked portion in which a part of the color conversion layer of the predetermined type and a part of the color conversion layer of the different type overlap each other;
a first subpixel including the color conversion layer of the predetermined type formed on the light exit surfaces of the two or more of the light-emitting elements, the first subpixel not including the color conversion layer of the different type formed on the light exit surfaces of the two or more of the light-emitting elements;
a second subpixel including the color conversion layer of the different type, the second subpixel not including the color conversion layer of the predetermined type; and
a third subpixel not including either the color conversion layer of the predetermined type or the color conversion layer of the different type.

2. The light-emitting device according to claim 1, wherein
the predetermined type of the color conversion layer is continuously formed on the light exit surfaces of the two or more of the light-emitting elements arranged in a column-wise direction, and
the different type of the color conversion layer is continuously formed on the light exit surfaces of the two or more of the light-emitting elements arranged in a row-wise direction.

3. The light-emitting device according to claim 1, wherein an emission intensity of light emitted from the light exit surfaces of the four or more light-emitting elements after transmission through the stacked portion is 50% or lower of an emission intensity of the light before transmission through the stacked portion.

4. The light-emitting device according to claim 1, wherein the light-emitting elements include a light-emitting element disposed on the substrate directly below the stacked portion.

5. The light-emitting device according to claim 1, wherein the light-emitting elements are LEDs.

6. The light-emitting device according to claim 5, wherein the LEDs include an LED having a cathode electrode disposed directly below the stacked portion.

7. A display device comprising:
the light-emitting device according to claim 1; and
a drive circuit that controls emission of light from the four or more light-emitting elements of the light-emitting device.

* * * * *